United States Patent
Tsai et al.

(10) Patent No.: US 7,949,086 B2
(45) Date of Patent: May 24, 2011

(54) SHIFT REGISTER

(75) Inventors: Tsung-ting Tsai, Hsin-Chu (TW); Yung-chih Chen, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 53 days.

(21) Appl. No.: 12/480,020

(22) Filed: Jun. 8, 2009

(65) Prior Publication Data

US 2009/0304139 A1    Dec. 10, 2009

(30) Foreign Application Priority Data

Jun. 6, 2008 (TW) .............................. 97121314 A

(51) Int. Cl.
*G11C 19/00* (2006.01)
(52) U.S. Cl. ................................ 377/64; 377/78; 377/79
(58) Field of Classification Search ............ None
See application file for complete search history.

(56) References Cited

U.S. PATENT DOCUMENTS

| 4,651,148 | A | 3/1987 | Takeda et al. |
| 5,222,082 | A | 6/1993 | Plus |
| 5,517,542 | A | 5/1996 | Huq |
| 6,845,140 | B2 | 1/2005 | Moon et al. |
| 7,310,402 | B2 | 12/2007 | Wei et al. |
| 7,450,681 | B2 * | 11/2008 | Wei et al. ............. 377/64 |
| 7,627,077 | B2 * | 12/2009 | Wei et al. ............. 377/64 |
| 7,688,934 | B2 * | 3/2010 | Tsai et al. ............ 377/64 |
| 7,746,314 | B2 * | 6/2010 | Wei et al. ............ 345/100 |
| 2003/0189542 | A1 | 10/2003 | Lee et al. |
| 2006/0017685 | A1 | 1/2006 | Tseng et al. |
| 2006/0284815 | A1 | 12/2006 | Kwon et al. |
| 2007/0237285 | A1 * | 10/2007 | Chien et al. ............ 377/64 |
| 2010/0150303 | A1 * | 6/2010 | Tsai et al. ............. 377/79 |

FOREIGN PATENT DOCUMENTS

TW    I246086    12/2005

* cited by examiner

*Primary Examiner* — Tuan Lam

(57) ABSTRACT

A shift register includes a plurality of register units cascade-connected with each other. Each register unit includes a pull-up circuit, a pull-up driving circuit, a pull-down circuit, and a pull-down driving circuit. The pull-up circuit coupled to a first clock signal is used for providing an output signal. The pull-up driving circuit turns on in response to a driving pulse from a previous register unit and a second clock signal, and turns off in response to a third clock signal. The pull-down driving circuit which is coupled to an input node of the pull-down circuit, turns on in response to a first clock signal, and turns off in response to a the first clock signal or output of the pull-up driving circuit.

14 Claims, 4 Drawing Sheets

SHIFT REGISTER

CLAIM OF PRIORITY

This application claims priority to Taiwanese Patent No. 097121314 filed on Jun. 6, 2008.

BACKGROUND OF THE INVENTION

1. Field of the Invention

The present invention relates to a shift register, and more particularly, to a shift register capable of pre-charging to extend a time period of charging pixels.

2. Description of the Related Art

With a rapid development of monitor types, novel and colorful monitors with high resolution, e.g., liquid crystal displays (LCDs), are indispensable components used in various electronic products such as monitors for notebook computers, personal digital assistants (PDAs), digital cameras, and projectors. The demand for the novelty and colorful monitors has increased tremendously. A Low Temperature Poly-Silicon Liquid Crystal Display (LTPS LCD) panel, on account of high resolution demands, is widely applied to various electronic devices.

Referring to FIG. 1 showing a functional block diagram of a conventional liquid crystal display 10, the liquid crystal display 10 includes a liquid crystal panel 12, a gate driver 14, and a source driver 16. The liquid crystal panel 12 includes a plurality of pixels, each pixel having three pixel units 20 indicating three primary colors, red, green, and blue. For example, the liquid crystal display 12 with 1024 by 768 pixels contains 1024×768×3 pixel units 20. The gate driver 14 periodically outputs a scanning signal to turn on each transistor 22 of the pixel units 20 row by row, meanwhile, each pixel units 20 is charged to a corresponding voltage based on a data signal from the source driver 16, to show various gray levels. After a row of pixel units is finished to be charged, the gate driver 14 stops outputting the scanning signal to this row, and then outputs the scanning signal to turn on the transistors 22 of the pixel units of the next row. Sequentially, until all pixel units 20 of the liquid crystal panel 12 finish charging, and the gate driver 14 outputs the scanning signal to the first row again and repeats the above-mentioned mechanism.

As to the conventional liquid crystal display, the gate driver 14 functions as a shift register. In other words, the gate driver 16 outputs a scanning signal to the liquid crystal display 12 at a fixed interval. For instance, a liquid crystal display 12 with 1024×768 pixels and its operating frequency with 60 Hz is provided, the display interval of each frame is about 16.67 ms (i.e., 1/60 second), such that an interval between two scanning signals applied on two row adjacent lines is about 21.7 μs (i.e., 16.67 ms/768). The pixel units 20 are charged and discharged by data voltage from the source driver 16 to show corresponding gray levels in the time period of 21.7 μs accordingly.

Unfortunately, regarding the gate driver 14 manufactured with an amorphous silicon (a-Si) technology, the liquid crystal display 12 may display unevenly due to a voltage stress phenomenon which causes a discrepancy of threshold voltages of any two transistors. Referring to FIG. 2 illustrating a timing diagram of a conventional shift register, as disclosed in U.S. Pat. No. 7,310,402, output OUT-N of the shift register fails to reach high voltage level rapidly, and thus the transistor of the pixel is incapable of being turned on in time, such that a charge time period of the pixel is limited. Therefore, it is possible that insufficient charge time period for the pixel may degrade display quality.

A shift register disclosed in U.S. Pat. No. 5,222,082 includes a plurality of register units electrically coupled in cascade. Each register unit is used for delaying an input signal and outputting an output signal based on clock signals. Then the next register unit delays the output signal of the previous register unit, and thus outputs an output signal. However, voltage applied at gates of transistors of each register unit may keep a high voltage level for a long while until next scanning period for the next frame. In this way, the gate voltage applied to the transistors results in a voltage shift. When the transistor is under a positive voltage stress, the longer the stress time is, the greater the shift range of threshold voltage of the transistor is. However, the stress time of the positive voltage stress may degrade operation efficiency and reduce the life of the transistor, even shorten the life of the whole shift register.

In order to reduce the damage of the transistor caused by the voltage stress phenomenon that the high voltage level is applied at the gate of the transistor for a long while, a resolution is to shorten a time period over which the high voltage level is applied at the gate of the transistor. A shift register disclosed in U.S. Pat. No. 5,517,542, the delay output of the Nth stage register unit is controlled by the output $OUT_{n+2}$ of the (N+2)th stage register unit. A shift register disclosed in U.S. Pat. No. 6,845,140, the delay output of the Nth stage register unit $SR_N$ is controlled by the output $GOUT_{N+1}$ of the (N+1)th stage register unit $SR_{N+1}$. In other words, a transition of the gate voltage of the current transistor from the high voltage level to the low voltage level is determined by the output signal of the next stage or the next two stage register unit of such two shift registers, so that the voltage applied on the gate of the transistor does not keep the high voltage level for a long time, thereby reducing voltage stress phenomenon for the transistor. Because such two register units utilize the output signal of next stage or next two stage register units as a control signal to adjust the transition of the gate voltage of the transistor of the current register unit, the signal interference inevitably occurs.

SUMMARY OF THE INVENTION

It is therefore an objective of the present invention to provide a shift register capable of pre-charging to extend not only charge time period, but also life expectancy of the shift register, so as to solve the problem of prior art mentioned above.

Briefly summarized, a shift register comprises a plurality of register units cascaded-connected with each other. Each register unit is used for outputting an output signal at an output end based on a first clock signal, a second signal, a third clock signal, a fourth clock signal, and a driving signal from a previous stage register unit. Each register unit comprises a pull-up circuit coupled to the first clock signal, for providing the output signal; a pull-up driving circuit coupled to the pull-up circuit, being turned on in response to the driving signal from the previous stage register unit, and the second clock signal, and being turned off in response to the third clock signal; a pull-down circuit, for providing a supply voltage; and a pull-down driving circuit coupled to an input node and the pull-up driving circuit, for turning on the pull-down circuit in response to the first clock signal, and for turning off the pull-down circuit in response to the third clock signal or output of the pull-up driving circuit.

In one aspect of the present invention, the pull-up circuit comprises a first transistor and a second transistor. The first transistor comprises a drain coupled to the first clock signal, a gate coupled to an input node of the pull-up circuit, and a source coupled to the output end The second transistor comprises a drain coupled to the first clock signal, a gate coupled to the input node of the pull-up circuit, and a source coupled to a driving signal end. The pull-up driving circuit comprises a third transistor, a capacitor, a fourth transistor, a fifth transistor, and a sixth transistor. The third transistor comprises a drain, a gate, both coupled to a driving signal end of the previous stage register unit, and a source coupled to the input node of the pull-up circuit. The capacitor is coupled between the input node of the pull-up circuit and the second clock signal. The fourth transistor comprises a drain coupled to the input node of the pull-up circuit, a gate coupled to the third clock signal, and a source coupled to the supply voltage. The fifth transistor comprises a drain coupled to the driving signal end, a gate coupled to the third clock signal, and a source coupled to the supply voltage. The sixth transistor comprises a drain coupled to the output end, a gate coupled to the third clock signal, and a source coupled to the supply voltage. The pull-down circuit comprises a seventh transistor and an eighth transistor. The seventh transistor comprises a drain coupled to the input node of the pull-up circuit, a gate coupled to the input node of the pull-down circuit, and a source coupled to the supply voltage. The eighth transistor comprises a drain coupled to the driving signal end, a gate coupled to the input node of the pull-down circuit, and a source coupled to the supply voltage. The pull-down driving circuit comprises a ninth transistor, a tenth transistor, and an eleventh transistor. The ninth transistor comprises a drain, a gate both coupled to the first clock signal, and a source coupled to the input node of the pull-down circuit. The tenth transistor comprises a drain coupled to the input node of the pull-down circuit, a gate coupled to the third clock signal, and a source coupled to the supply voltage. The eleventh transistor comprises a drain coupled to the input node of the pull-down circuit, a gate coupled to the input node of the pull-up circuit, and a source coupled to the supply voltage.

In another aspect of the present invention, a phase difference between the first clock signal and the second clock signal is 180 degrees, a phase difference between the third clock signal and the fourth clock signal is 180 degrees, a phase difference between the first clock signal and the third clock signal is 90 degrees, and a phase difference between the second clock signal and the fourth clock signal is 90 degrees The present invention will be described with reference to the accompanying drawings, which show exemplary embodiments of the present invention.

DETAILED DESCRIPTION OF THE INVENTION

Figure 1:
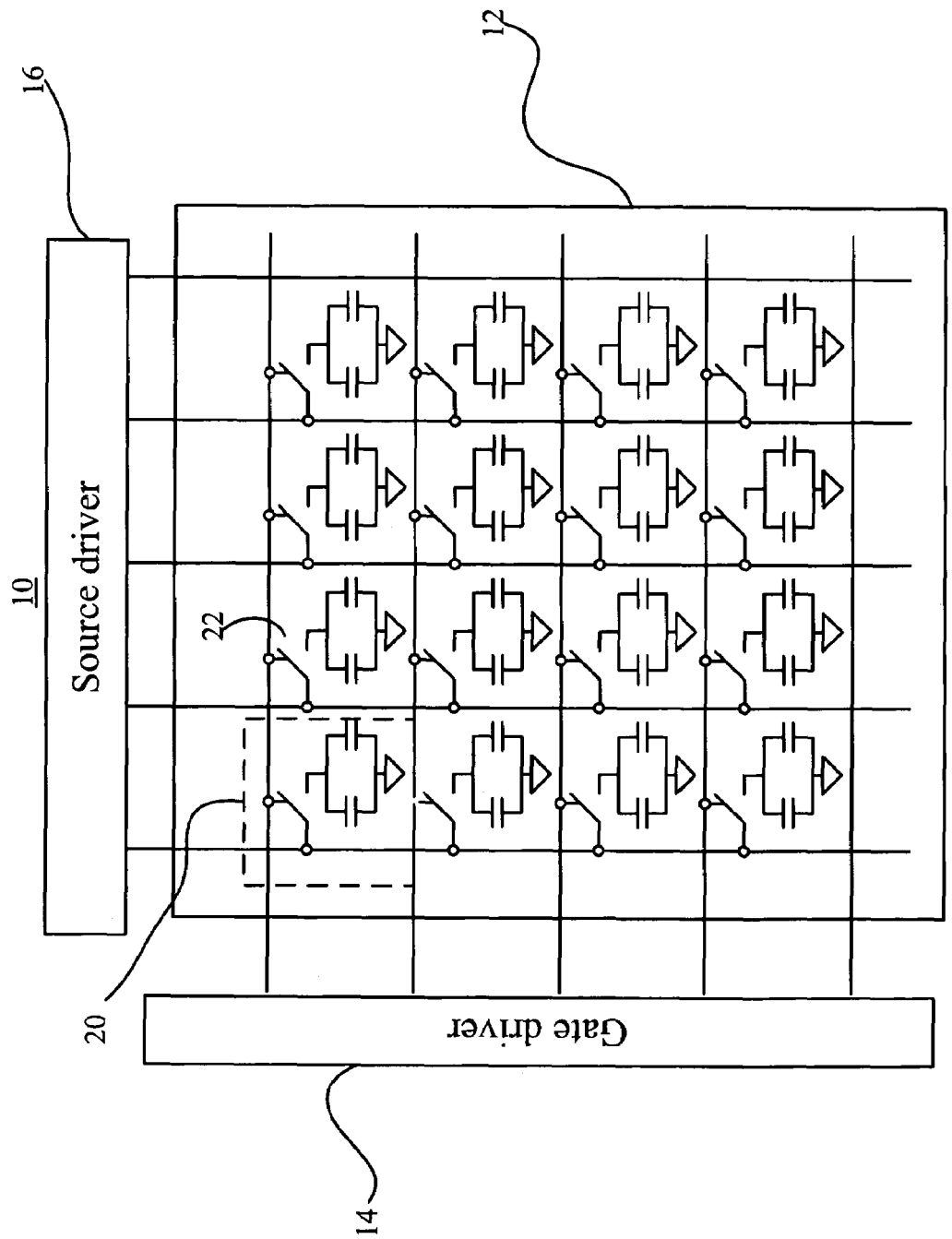
FIG. 1 shows a functional block diagram of a conventional liquid crystal display.
Figure 2:
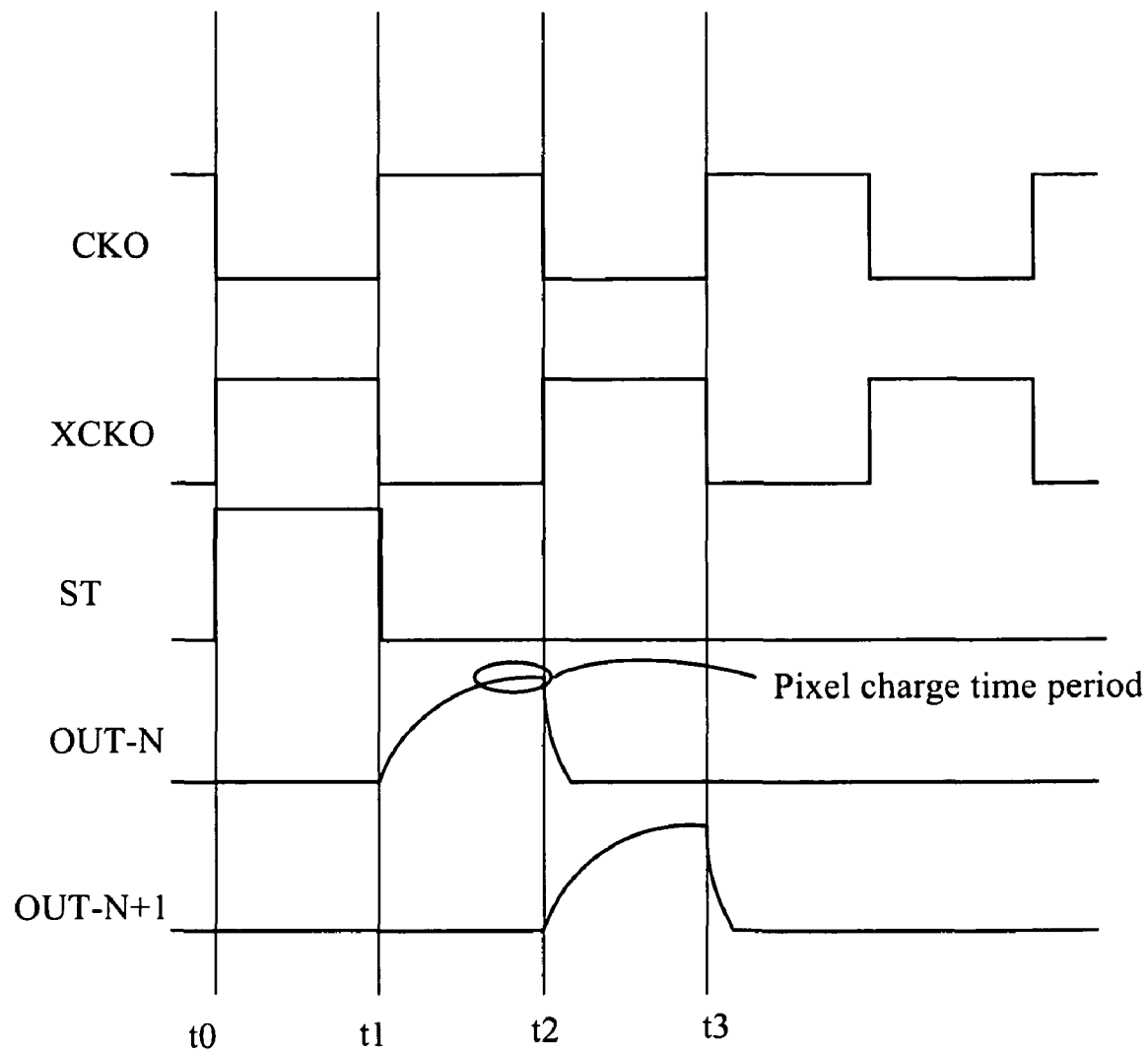
FIG. 2 illustrates a timing diagram of a conventional shift register.
Figure 3:
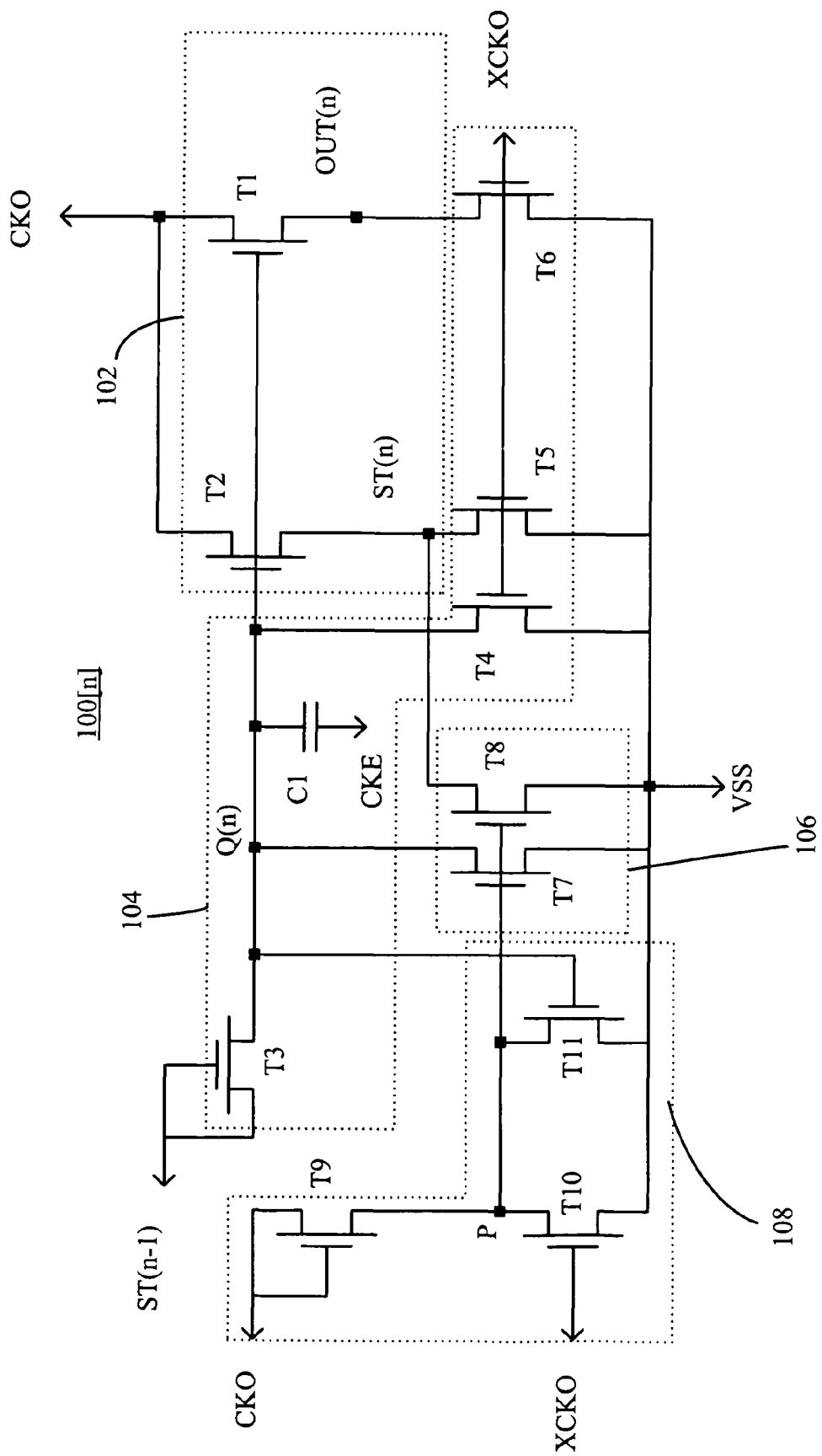
FIG. 3 shows a circuit diagram of a register unit of the shift register of the present invention.

Referring to FIG. 3 showing a circuit diagram of a register unit 100 of the shift register of the present invention, the shift register of the embodiment can be applied to a liquid crystal display. The shift register comprises a plurality of cascade-connected register units 100[n]. Each register unit 100[n] outputs a scan signal according to a first clock signal CKO, a second clock signal CKE, a third clock signal XCKO, a fourth clock signal XCKE, and a driving signal from a previous register unit 100[n−1]. When a first-stage register unit 100[1] receives a start pulse Vst from an input ST(0), the register unit 100[1] outputs an output signal at an output end OUT(1) in the next clock cycle. Similarly, each register unit 100[n] outputs an output signal at an output end OUT(n) in the next clock cycle, according to a first clock signal CKO, a second clock signal CKE, a third clock signal XCKO, a fourth clock signal XCKE, and a driving signal from a driving signal end ST(n−1) of a register unit 100[n−1]. The output signal is a scan signal pulse for turning on corresponding pixel transistors. The first clock signal CKO is out of phase with the second clock signal CKE by 180 degrees, and the third clock signal XCKO is out of phase with the fourth clock signal XCKE by 180 degrees. The first clock signal CKO is out of phase with the third clock signal XCKO by 90 degrees, and the second clock signal XCKO is out of phase with the fourth clock signal XCKE by 90 degrees.

Each register unit 100[n] comprises a pull-up circuit 102, a pull-up driving circuit 104, a pull-down circuit 106 and a pull-down driving circuit 108. The pull-up circuit 102 is coupled with the first clock signal CKO, providing an output signal at the output end OUT(N). The pull-up driving circuit 104 is turned on when receiving the driving signal pulse from the register unit 100[n−1] and the second clock signal CKE. The pull-up driving circuit 104 is turned off when receiving the third clock signal XCKO. The pull-down circuit 106 is coupled to a supply voltage Vss. The pull-down driving circuit 108 enables the pull-down circuit 106 when receiving the first clock signal CKO, and disables the pull-down circuit 106 when receiving the third clock signal XCKO or output of the pull-up driving circuit 104.

The pull-up circuit 102 comprises a first transistor T1 and a second transistor T2. The drain of the first transistor T1 is coupled with the first clock signal CKO, and the gate of the first transistor T1 is coupled with an input node Q(n) of the pull-up circuit 102. The source of the first transistor T1 is coupled with an output end OUT(N). The drain of the second transistor T2 is coupled with the first clock signal CKO, and the gate of the second transistor T2 is coupled with the input node Q(n) of the pull-up circuit 102. The source of the second transistor T2 is coupled with a driving signal end ST(N).

The pull-up driving circuit 104 comprises a third transistor T3, a capacitor C1, a fifth transistor T5 and a sixth transistor T6. The drain and gate of the third transistor T3 are coupled with the driving signal end ST(N−1) of the register unit 100[n−1]. The source of the third transistor T3 is coupled with the input node Q(n). The capacitor C1 is coupled between the input node Q(n) and the second clock signal CKE. The drain of the fourth transistor T4 is coupled with the input node Q(n), and the gate of the fourth transistor T4 is coupled with the third clock signal XCKO. The source of the fourth transistor T4 is coupled with the supply voltage Vss. The drain of the fifth transistor T5 is coupled with driving signal end ST(N), and the gate of the fifth transistor T5 is coupled with the third clock signal XCKO. The source of the fifth transistor T5 is coupled with the supply voltage Vss. The drain of the sixth transistor T6 is coupled with the output end OUT(N), and the gate of the sixth transistor T6 is coupled with the third clock signal XCKO. The source of the sixth transistor T6 is coupled with the supply voltage Vss.

The pull-down circuit 106 comprises a seventh transistor T7 and an eighth transistor T8. The drain of the seventh transistor T7 is coupled with the input node Q(n) of the pull-up circuit 102, and the gate of the seventh transistor T7 is coupled with an input node P of the pull-down circuit 106. The source of the seventh transistor T7 is coupled with the supply voltage Vss. The drain of the eighth transistor T8 is coupled with the driving signal end ST(N), and the gate of the eighth transistor T8 is coupled with the input node P of the pull-down circuit 106. The source of the eighth transistor T8 is coupled with the supply voltage Vss.

The pull-down driving circuit 108 comprise of a ninth transistor T9, a tenth transistor T10, and an eleventh transistor T11. The drain and gate of the ninth transistor T9 is coupled with the first clock signal CKO. The source of the ninth transistor T9 is coupled with the input node P of the pull-down circuit 106. The drain of the tenth transistor T10 is coupled with the input node P of the pull-down circuit 106, and the gate of the tenth transistor T10 is coupled with the third clock signal XCKO. The source of the tenth transistor T10 is coupled with the supply voltage Vss. The drain of the eleventh transistor T11 is coupled with the input node P of the pull-down circuit 106, and the gate of the eleventh transistor T11 is coupled with the input node Q(n) of the pull-up circuit 102. The source of the eleventh transistor T11 is coupled with the supply voltage Vss.

Figure 4:
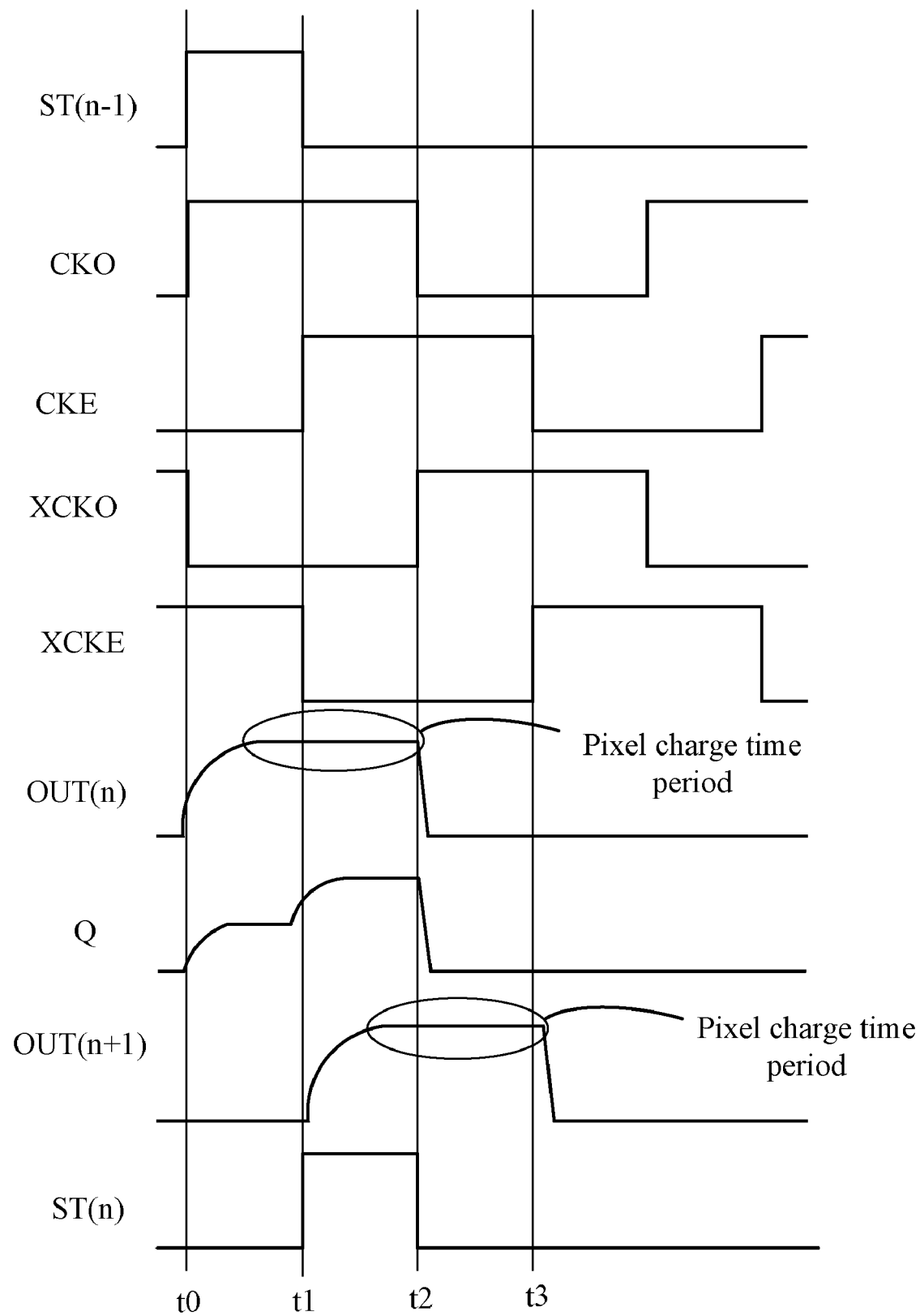
FIG. 4 is a timing diagram of each signal and each node in FIG. 3.

Please refer to FIG. 3 and FIG. 4. FIG. 4 is a timing diagram of each signal and each node in FIG. 3. During a time period t0-t1, the first clock signal CKO and the fourth clock signal XCKE are at high voltage level, while the second clock signal CKE and the third clock signal XCKO are at low voltage level. The driving signal from the driving signal end ST(n−1) of the register unit 100[n−1] is also at the high voltage level so as to turn on the transistor T3. Then, the voltage level at the node Q(n) is raised up so as to turn on the transistor T1 and the transistor T2. As a result, voltage level at the output end OUT(n) also starts to move upwards high voltage level due to a transmission of the first clock signal CKO. At this moment, the third clock signal XCKO is at low voltage level, therefore the transistors T4, T5, T10 and T6 are turned off, while the first clock signal CKO and the fourth clock signal XCKE are at high voltage level, therefore the transistor T9 is turned on so that the voltage level at the node P is raised up to high voltage level so as to turn on the transistor T7 and the transistor T8 of the pull-down circuit 106. As a consequence, the voltage level at the driving signal end ST(n) is kept at low voltage level. At this time, the capacitor C1 stores a voltage drop between the node Q(n) and the second clock signal CKE.

During a time period t1-t2, the first clock signal CKO and the second clock signal CKE are at high voltage level, and the third clock signal XCKO and the fourth clock signal XCKE is at low voltage level. The driving signal from the driving signal end ST(n−1) of the register unit 100[n−1] is at low voltage level so as not to turn on the transistor T3. However, because the second clock signal CKE is at high voltage level, the voltage level at the node Q(n) is drifted up with the voltage difference stored in the capacitor C1. Consequently, the voltage level at the node Q(n) is at the high voltage level so as to turn on the transistor T1 and the transistor T2. Therefore, the first clock signal CKO is transmitted so as to keep high voltage level at the output end OUT(N). At the moment, the transistor T7 and the transistor T8 of the pull-down circuit 106 are kept off, so the voltage level at the driving signal end ST(n) is kept at high voltage level because of the first clock signal CKO, and outputted to the register unit 100[n+1].

During the time period t2-t3, the second clock signal CKE and the third signal XCKO are at high voltage level, while the first clock signal CKO and the fourth clock signal XCKE are at low voltage level. At this moment, the pull-up circuit 102 and the pull-down circuit 106 are turned off, and the transistor T4 and the transistor T5 are turned on, which pulls the voltage level at the output end OUT(n) down to the low voltage level. The voltage at the driving signal end ST(n) is kept at low voltage level.

The shift register of the present embodiment can be applied to the gate driver of a LCD.

Compared to prior art, when a triggering pulse is fed to the present inventive register unit, the register unit starts to produce a scan signal to turn on a transistor of the corresponding pixel in advance, so that the transistor is able to be pre-charged. When the data signal from the current-staged shift register comes, the scan signal has reached at the high voltage so as to completely turn on the transistor of the corresponding pixel, thus rapidly feeding the data signal. Additionally, by the cycle of the clock signal that a transition from high level to low level, the time period that the scan signal descends its voltage level is largely reduced. Moreover, the shift register of the present invention adopts smaller clock frequency, that is, the clock frequency is as half as that of the start signal, to drive the transistor, which extends operational life expectancy of the circuit. As a result, the shift register of the present invention not only produces better wave shape of the output signal, but also creates longer operational life expectancy of the circuit to pass the quality test. Because the power consumption is positive proportionate to operational frequency, the lower operational frequency brings lower power consumption, meaning more energy-saving. Besides, the shift register at each stage is driven by the initial signal produced by the previous-staged shift register, other than the output signal produced by the next-staged register unit, therefore additional register unit is not required, which decreases practical problems.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A shift register comprising:
 a plurality of register units cascaded-connected with each other, each register unit for outputting an output signal at an output end based on a first clock signal, a second signal, a third clock signal, and a driving signal from a previous stage register unit, each register unit comprising:
  a pull-up circuit coupled to the first clock signal, for providing the output signal;
  a pull-up driving circuit coupled to the pull-up circuit, being turned on in response to the driving signal from the previous stage register unit, and the second clock signal, and being turned off in response to the third clock signal;
  a pull-down circuit, for providing a supply voltage; and
  a pull-down driving circuit coupled to the pull-up driving circuit, for turning on the pull-down circuit in response to the first clock signal, and for turning off the pull-down circuit in response to the third clock signal or output of the pull-up driving circuit.

2. The shift register of claim 1, wherein the pull-up circuit comprises:
 a first transistor comprising a drain coupled to the first clock signal, a gate coupled to an input node of the pull-up circuit, and a source coupled to the output end; and
 a second transistor comprising a drain coupled to the first clock signal, a gate coupled to the input node of the pull-up circuit, and a source coupled to a driving signal end.

3. The shift register of claim 2, wherein the pull-up driving circuit comprises:
a third transistor comprising a drain, a gate, both coupled to a driving signal end of the previous stage register unit, and a source coupled to the input node of the pull-up circuit;
a capacitor coupled between the input node of the pull-up circuit and the second clock signal;
a fourth transistor comprising a drain coupled to the input node of the pull-up circuit, a gate coupled to the third clock signal, and a source coupled to the supply voltage;
a fifth transistor comprising a drain coupled to the driving signal end, a gate coupled to the third clock signal, and a source coupled to the supply voltage; and
a sixth transistor comprising a drain coupled to the output end, a gate coupled to the third clock signal, and a source coupled to the supply voltage.

4. The shift register of claim 3, wherein the pull-down circuit comprises:
a seventh transistor comprising a drain coupled to the input node of the pull-up circuit, a gate coupled to the input node of the pull-down circuit, and a source coupled to the supply voltage; and
an eighth transistor comprising a drain coupled to the driving signal end, a gate coupled to the input node of the pull-down circuit, and a source coupled to the supply voltage.

5. The shift register of claim 4, wherein the pull-down driving circuit comprises:
a ninth transistor comprising a drain, a gate both coupled to the first clock signal, and a source coupled to the input node of the pull-down circuit;
a tenth transistor comprising a drain coupled to the input node of the pull-down circuit, a gate coupled to the third clock signal, and a source coupled to the supply voltage;
an eleventh transistor comprising a drain coupled to the input node of the pull-down circuit, a gate coupled to the input node of the pull-up circuit, and a source coupled to the supply voltage.

6. The shift register of claim 1, wherein a phase difference between the first clock signal and the second clock signal is 90 degrees, and a phase difference between the first clock signal and the third clock signal is 180 degrees.

7. The shift register of claim 1 being applied in a liquid crystal display.

8. A register unit comprising:
a pull-up circuit coupled to a first clock signal, for providing the output signal;
a pull-up driving circuit coupled to the pull-up circuit, being turned on in response to the driving signal from the previous stage register unit, and a second clock signal, and being turned off in response to a third clock signal;
a pull-down circuit, for providing a supply voltage; and
a pull-down driving circuit coupled to the pull-up driving circuit, for turning on the pull-down circuit in response to the first clock signal, and for turning off the pull-down circuit in response to the third clock signal or output of the pull-up driving circuit.

9. The register unit of claim 8, wherein the pull-up circuit comprises:
a first transistor comprising a drain coupled to the first clock signal, a gate coupled to an input node of the pull-up circuit, and a source coupled to the output end; and
a second transistor comprising a drain coupled to the first clock signal, a gate coupled to the input node of the pull-up circuit, and a source coupled to a driving signal end.

10. The register unit of claim 9, wherein the pull-up driving circuit comprises:
a third transistor comprising a drain, a gate, both coupled to a driving signal end of the previous stage register unit, and a source coupled to the input node of the pull-up circuit;
a capacitor coupled between the input node of the pull-up circuit and the second clock signal;
a fourth transistor comprising a drain coupled to the input node of the pull-up circuit, a gate coupled to the third clock signal, and a source coupled to the supply voltage;
a fifth transistor comprising a drain coupled to the driving signal end, a gate coupled to the third clock signal, and a source coupled to the supply voltage; and
a sixth transistor comprising a drain coupled to the output end, a gate coupled to the third clock signal, and a source coupled to the supply voltage.

11. The register unit of claim 10, wherein the pull-down circuit comprises:
a seventh transistor comprising a drain coupled to the input node of the pull-up circuit, a gate coupled to the input node of the pull-down circuit, and a source coupled to the supply voltage; and
an eighth transistor comprising a drain coupled to the driving signal end, a gate coupled to the input node of the pull-down circuit, and a source coupled to the supply voltage.

12. The register unit of claim 11, wherein the pull-down driving circuit comprises:
a ninth transistor comprising a drain, a gate both coupled to the first clock signal, and a source coupled to the input node of the pull-down circuit;
a tenth transistor comprising a drain coupled to the input node of the pull-down circuit, a gate coupled to the third clock signal, and a source coupled to the supply voltage;
an eleventh transistor comprising a drain coupled to the input node of the pull-down circuit, a gate coupled to the input node of the pull-up circuit, and a source coupled to the supply voltage.

13. The register unit of claim 8, wherein a phase difference between the first clock signal and the second clock signal is 90 degrees, and a phase difference between the first clock signal and the third clock signal is 180 degrees.

14. The register unit of claim 8, wherein the driving signal is a start pulse.

* * * * *